(12) United States Patent
Ookawa et al.

(10) Patent No.: US 8,569,629 B2
(45) Date of Patent: Oct. 29, 2013

(54) FLEXIBLE PRINTED CIRCUIT BOARD

(75) Inventors: Tadao Ookawa, Ibaraki (JP); Mitsuru Honjo, Ibaraki (JP); Daisuke Yamauchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 247 days.

(21) Appl. No.: 12/768,258

(22) Filed: Apr. 27, 2010

(65) Prior Publication Data

US 2010/0276183 A1 Nov. 4, 2010

(30) Foreign Application Priority Data

Apr. 30, 2009 (JP) ................................. 2009-110487
Jan. 7, 2010 (JP) ................................. 2010-001958

(51) Int. Cl.
| | | |
|---|---|---|
| *H05K 1/00* | (2006.01) | |
| *H05K 1/03* | (2006.01) | |
| *H05K 1/16* | (2006.01) | |
| *H05K 1/18* | (2006.01) | |
| *H05K 7/00* | (2006.01) | |
| *H01B 7/08* | (2006.01) | |

(52) U.S. Cl.
USPC ........ 174/254; 174/255; 174/260; 174/117 F; 174/117 FF; 361/748; 361/749

(58) Field of Classification Search
USPC ................. 174/254, 117 F, 117 FF, 255, 260; 349/150, 149; 360/245.9, 246; 361/748, 749
See application file for complete search history.

(56) References Cited

U.S. PATENT DOCUMENTS

| | | | |
|---|---|---|---|
| 5,657,104 A | 8/1997 | Kanezawa | |
| 5,717,476 A | 2/1998 | Kanezawa | |
| RE37,945 E | 12/2002 | Kanezawa | |
| RE38,053 E | 4/2003 | Kanezawa | |
| 6,963,471 B2 * | 11/2005 | Arai et al. ..................... | 360/246 |

(Continued)

FOREIGN PATENT DOCUMENTS

| | | |
|---|---|---|
| CN | 1152721 A | 6/1997 |
| JP | 2003-308668 A | 10/2003 |
| JP | 2008-300803 A | 12/2008 |

OTHER PUBLICATIONS

Office Action issued Jul. 19, 2013 in CN Application No. 201010160851.4.

(Continued)

*Primary Examiner* — Jayprakash N Gandhi
*Assistant Examiner* — Arun Ramaswamy
(74) *Attorney, Agent, or Firm* — Panitch Schwarze Belisario & Nadel LLP

(57) ABSTRACT

An FPC board includes a base insulating layer. A plurality of wiring traces are formed on the base insulating layer. The adjacent wiring traces are arranged at a distance d from each other, and each wiring trace has a predetermined width and a thickness t1. Each transmission line pair is constituted by the two adjacent wiring traces of the plurality of wring traces. A ratio of the thickness t1 of the wiring trace to the distance d between the adjacent wiring traces is set to 0.8 or more. A cover insulating layer may be formed on the base insulating layer to cover the wiring traces. A metal layer having a predetermined thickness may be provided on a back surface of the base insulating layer. Furthermore, a differential impedance of each transmission line pair may be set to 100 Ω.

4 Claims, 3 Drawing Sheets

(56) References Cited

U.S. PATENT DOCUMENTS

2002/0017963 A1* 2/2002 Shimamoto et al. .............. 333/1
2006/0113669 A1* 6/2006 Ookawa et al. ............... 257/752
2008/0296048 A1 12/2008 Muro et al.

OTHER PUBLICATIONS

Office Action issued Aug. 13, 2013 in JP Application No. 2010-001958.

* cited by examiner

FLEXIBLE PRINTED CIRCUIT BOARD

BACKGROUND OF THE INVENTION

1. Field of the Invention

The present invention relates to a flexible printed circuit board.

2. Description of the Background Art

A flexible printed circuit (hereinafter referred to as FPC) board is used as a transmission path of digital signals between a central processing unit (hereinafter referred to as CPU) and a liquid crystal display in information communications equipment such as a cellular telephone. Prime constituents of the FPC board include a base insulating layer and conductive wiring traces formed on the insulating layer.

In recent years, higher frequency of the digital signals to be used has been realized with an increased amount of information transmitted through the information communications equipment. In the FPC board, however, transmission of the digital signals in a high-frequency region may cause high-frequency noise resulting from the harmonic of the digital signals to be generated from the wiring traces.

In this case, the high-frequency noise generated from the FPC board leads to malfunctions of other electronic components in some cases. In a cellular telephone including a highly sensitive antenna, for example, the high-frequency noise generated from the FPC board may be received by the antenna. Such a phenomenon causes malfunctions.

Therefore, an FPC board that suppresses external emission of the high-frequency noise generated from the wiring traces has been proposed (see JP 2008-300803 A, for example).

Conductive traces are formed on an insulating base film, and an insulating layer is formed on the base film to cover the conductive traces in the FPC board of JP 2008-300803 A. In addition, a conductive layer is formed on the insulating layer. In this case, the conductive layer on the insulating layer is used as a shield material of electromagnetic waves. This suppresses external emission of electromagnetic wave noise generated from the conductive traces.

Sufficient flexibility of the FPC board is desired in consideration of reduction in size and increased variety of the structure of the information communications equipment.

In the FPC board of JP 2008-300803 A, however, the conductive layer is provided on the conductive traces with the insulating layer sandwiched therebetween as described above. This leads to lower flexibility than that of an FPC board with no conductive layer formed thereon.

SUMMARY OF THE INVENTION

An object of the present invention is to provide a flexible printed circuit board capable of ensuring its sufficient flexibility and sufficiently reducing emission of high-frequency noise.

(1) According to an aspect of the present invention, a printed circuit board includes a first insulating layer, and a plurality of conductor lines formed on one surface of the first insulating layer, wherein the conductor lines that are adjacent to each other constitute a transmission line pair, and a ratio of a thickness of the conductor line to a distance between the adjacent conductor lines is 0.8 or more.

In the printed circuit board, the ratio of the thickness of the conductor line to the distance between the adjacent conductor lines is set to 0.8 or more. This sufficiently reduces external emission of high-frequency noise generated at the time of transmission of high-frequency signals through the transmission line pair without impairing flexibility of the printed circuit board.

(2) The distance between the adjacent conductor lines may be not less than 10 μm and not more than 30 μm. In this case, the external emission of high-frequency noise generated at the time of transmission of high-frequency signals through the transmission line pair can be sufficiently reduced without drastically increasing effective differential impedance of the transmission line pair.

In addition, the transmission line pair is unlikely to be affected by metal, a ferroelectric material and a ferromagnetic material in the environment. This prevents change in the differential impedance of the transmission line pair even when the metal, the ferroelectric material or the ferromagnetic material exist in the environment.

(3) The thickness of each of the conductor lines may be not less than 8 μm and not more than 20 μm. In this case, sufficient flexibility of the printed circuit board can be ensured without drastically increasing the effective differential impedance of the transmission line pair.

(4) The printed circuit board may further include a conductive layer formed on the other surface of the first insulating layer, wherein a differential impedance of the transmission line pair is not more than 100 Ω.

In this case, the external emission of high-frequency noise generated at the time of transmission of high-frequency signals through the transmission line pair can be more sufficiently reduced. In addition, high-frequency electrical characteristics can be stabilized.

Furthermore, the differential impedance of the transmission line pair can be sufficiently decreased as compared with a case where the conductive layer is not formed. Accordingly, the differential impedance can be 100 Ω or less while the ratio of the thickness of the conductor line to the distance between the adjacent conductor lines is maintained at 0.8 or more. This sufficiently provides impedance matching between the transmission line pair and low impedance elements.

(5) The printed circuit board may further include a second insulating layer formed on the one surface of the first insulating layer to cover the plurality of conductor lines. In this case, corrosion resistance of the conductor lines can be ensured.

(6) The first insulating layer may be made of polyimide. In this case, sufficient flexibility of the first insulating layer can be ensured.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
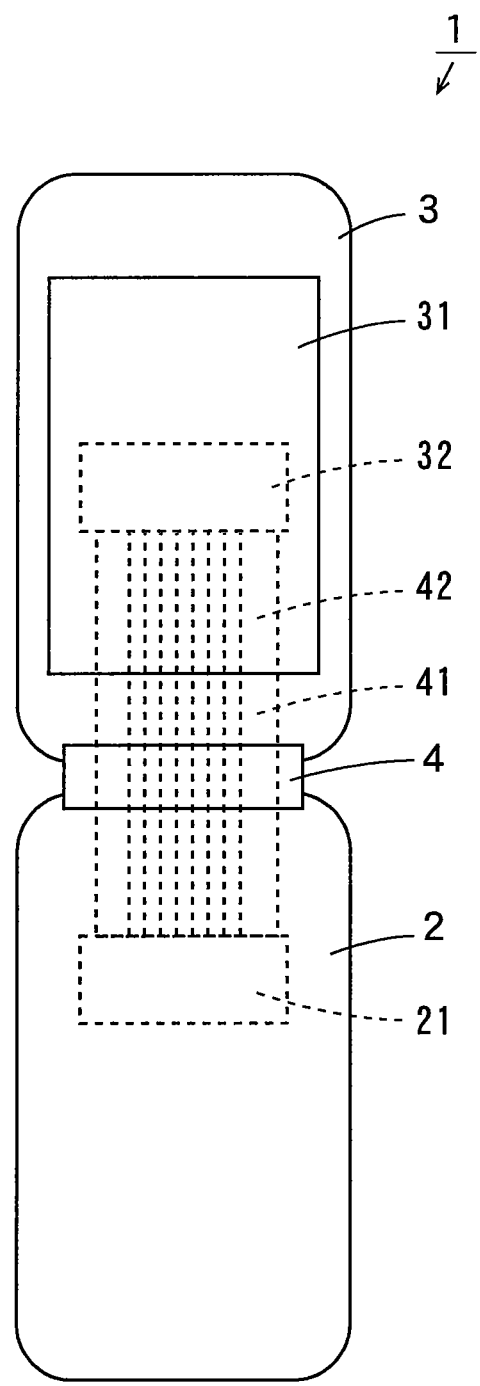
FIG. 1 is a schematic plan view showing the schematic structure of a cellular telephone including an FPC board according to one embodiment of the present invention.

Description will be made of a flexible printed circuit (hereinafter referred to as FPC) board according to one embodiment of the present invention while referring to the drawings. The FPC board according to the present embodiment is employed in information communications equipment such as a cellular telephone. The following paragraphs describe an example of employing the FPC board according to the present embodiment in a cellular telephone, and also describe details of the FPC board.

(1) Outline of Cellular Telephone

FIG. 1 is a schematic plan view showing the schematic structure of the cellular telephone including the FPC board according to the one embodiment of the present invention. The cellular telephone 1 includes a lower housing 2, an upper housing 3 and a hinge 4. The lower housing 2 and the upper housing 3 are connected to each other through the hinge 4 such that the lower housing 2 and the upper housing 3 can overlap each other.

The lower housing 2 includes a central processing unit (hereinafter referred to as CPU) 21 arranged therein. Signals and so on are input from operation buttons, not shown, which is provided in the lower housing 2 to the CPU 21. The CPU 21 controls each component of the cellar telephone 1 including an LCD driving circuit 32, described below.

The upper housing 3 is provided with a liquid crystal display (hereinafter referred to as LCD) 31, and includes the LCD driving circuit 32 arranged therein. The LCD 31 is electrically connected to the LCD driving circuit 32. The CPU 21 controls the LCD driving circuit 32 to drive the LCD 31. This causes characters and images to be displayed on the LCD 31.

An FPC board 41 is arranged to extend inside the lower housing 2, the hinge 4 and the upper housing 3. The FPC board 41 has a plurality of wiring traces 42. At least part of the plurality of wiring traces 42 constitutes a transmission line pair. The CPU 21 and the LCD driving circuit 32 are electrically connected to each other through the FPC board 41. This causes differential digital signals to be transmitted from the CPU 21 to the LCD driving circuit 32 through the transmission line pair of the FPC board 41.

(2) The FPC Board

Figure 2:
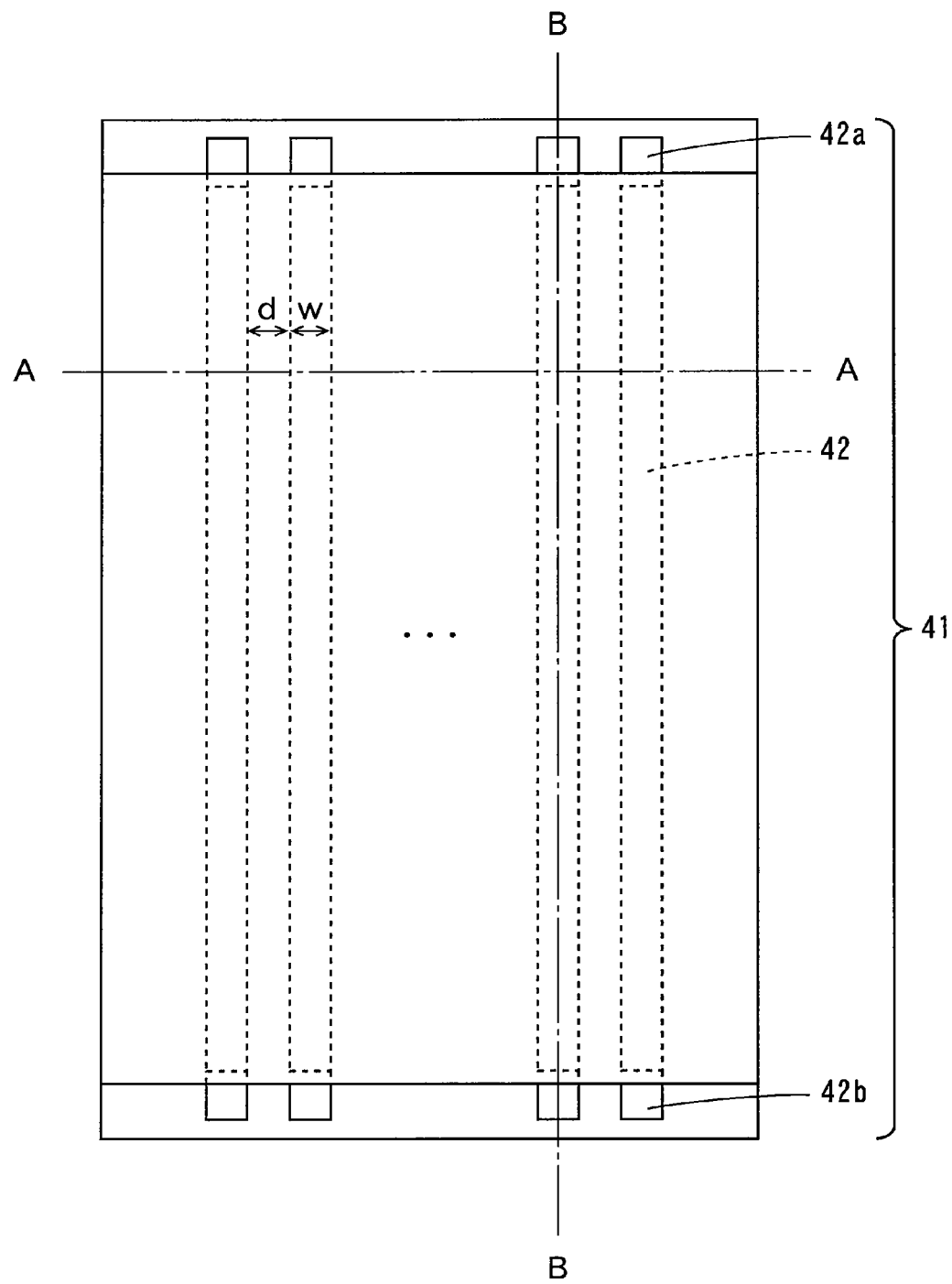
FIG. 2 is a schematic plan view of the FPC board of FIG. 1.
Figure 3:
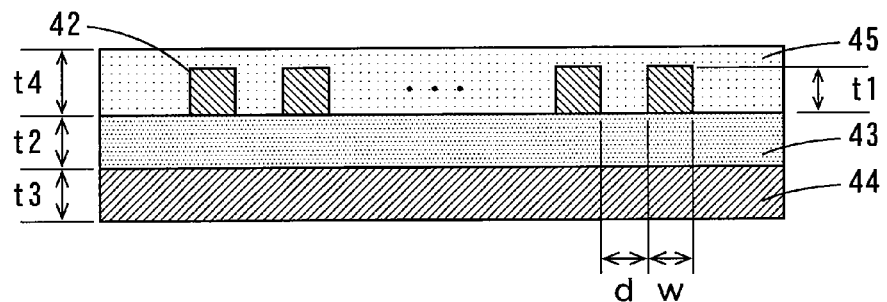
FIG. 3 is a sectional view of the FPC board of FIG. 2 taken along the line A-A.
Figure 4:
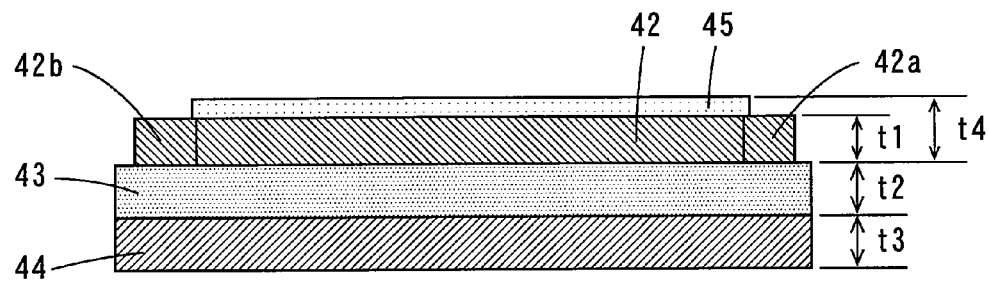
FIG. 4 is a sectional view of the FPC board of FIG. 2 taken along the line B-B.

Description will be made of the structure of the FPC board. FIG. 2 is a schematic plan view of the FPC board 41 of FIG. 1. FIGS. 3 and 4 are sectional views of the FPC board 41 of FIG. 2 taken along the line A-A and the line B-B, respectively.

As shown in FIGS. 3 and 4, the FPC board 41 includes a base insulating layer 43 that is made of polyimide and has a thickness t2. The plurality of wiring traces 42 made of copper are formed on the base insulating layer 43. The plurality of wring traces 42 are arranged to extend from one side to the other side of the FPC board 41. The adjacent wiring traces 42 are arranged at a distance d from each other, and each wiring trace 42 has a width w and a thickness t1. Each transmission line pair through which the foregoing digital signal is transmitted is constituted by the two adjacent wiring traces 42 of the plurality of wring traces 42.

A first connection pad 42a and a second connection pad 42b are formed at one end and the other end of each of the plurality of wiring traces 42, respectively. This causes the plurality of first connection pads 42a to be arranged at regular intervals along one side of the FPC board 41. The plurality of first connection pads 42a are electrically connected to a plurality of terminals, not shown, included in the LCD driving circuit 32 of FIG. 1, respectively. The plurality of second connection pads 42b are arranged at regular intervals along the other side of the FPC board 41. The plurality of second connection pads 42b are electrically connected to a plurality of terminals, not shown, included in the CPU 21 of FIG. 1, respectively.

A cover insulating layer 45 that is made of polyimide and has a thickness t4 is formed on the base insulating layer 43 to cover the wiring traces 42 excluding a region in which the plurality of first connection pads 42a are formed and a region in which the plurality of second connection pads 42b are formed. Furthermore, a metal layer 44 that is made of copper and has a thickness t3 is provided on a back surface of the base insulating layer 43.

A ratio (hereinafter referred to as aspect ratio) of the thickness t1 of the wiring trace 42 to the distance d between the adjacent wiring traces 42 is set to 0.8 or more in the FPC board 41 according to the present embodiment. Differential impedance of each transmission line pair is set to 100 Ω.

The distance d between the adjacent wiring traces 42 is preferably not less than 10 μm and not more than 30 μm, and more preferably not less than 10 μm and not more than 20 μm. The width w of the wiring trace 42 is preferably not less than 6 μm and not more than 50 μm, and more preferably not less than 10 μm and not more than 15 μm. The thickness t1 of the wiring trace 42 and the thickness t3 of the metal layer 44 are each preferably not less than 8 μm and not more than 20 μm, and more preferably not less than 10 μm and not more than 15 μm. The thickness t2 of the base insulating layer 43 is preferably not less than 4 μm and not more than 50 μm, and more preferably not less than 10 μm and not more than 30 μm. The thickness t4 of the cover insulating layer 45 is preferably not less than 2 μm and not more than 40 μm, and more preferably not less than 5 μm and not more than 30 μm.

(3) Effects (3-1) The Aspect Ratio

When high-frequency digital signals are transmitted through the wiring traces 42 on the FPC board 41, high-frequency noise resulting from the harmonic of the digital signals is generated from the wiring traces 42. The cellular telephone 1 generally includes a highly sensitive antenna that receives radio waves transmitted from a communication base station. Therefore, when the highly sensitive antenna receives the high-frequency noise, malfunctions such as disturbance in transmission of sound may occur.

In the FPC board 41 according to the present embodiment, the aspect ratio (t1/d) of the wiring trace 42 is set to 0.8 or more. This suppresses external emission of the high-frequency noise generated from the wiring traces 42. Moreover, a shield material for shielding the high-frequency noise need not be provided in the wiring traces 42. This allows sufficient flexibility of the FPC board 41 to be ensured.

(3-2) The Distance Between the Adjacent Wiring Traces

When the distance d between the adjacent wiring traces 42 is less than 10 μm, densities of currents flowing through the wiring traces 42 tend to be inhomogeneous due to the proximity effect. This significantly attenuates the strength of the high-frequency signal transmitted through the transmission line pair. Meanwhile, when the distance d between the adjacent wiring traces 42 exceeds 30 μm, the suppressive effect of the high-frequency noise is decreased. Accordingly, the distance d between the adjacent wiring traces 42 is preferably set to not less than 10 μm and not more than 30 μm.

The distance d between the adjacent wiring traces 42 is set to not less than 10 μm and not more than 30 μm, so that the transmission line pair is unlikely to be affected by metal, ferroelectric materials and ferromagnetic materials in the environment. This prevents change in the differential impedance of the transmission line pair even when the metal, the ferroelectric materials or the ferromagnetic materials exist in the environment.

(3-3) The Thickness of the Wiring Trace

A smaller thickness t1 of the wiring trace 42 leads to a smaller cross sectional area, resulting in larger conductor loss due to the skin effect. In particular, when the thickness t1 of the wiring trace is less than 8 μm, the strength of the high-frequency signal transmitted through the transmission line pair is significantly attenuated. On the other hand, when the thickness t1 of the wiring trace 42 exceeds 20 μm, the flexibility of the FPC board 41 is impaired. Accordingly, the thickness t1 of the wiring trace 42 is preferably set to not less than 8 μm and not more than 20 μm.

(3-4) The Metal Layer

The metal layer 44 is formed on the back surface of the base insulating layer 43 of the FPC board 41, so that the external emission of the high-frequency noise generated at the time of the transmission of the high-frequency signals through the transmission line pair can be more sufficiently reduced.

In addition, the metal layer 44 is formed to stabilize the high-frequency electrical characteristics.

Furthermore, when the metal layer 44 is formed, the differential impedance of the transmission line pair can be sufficiently decreased as compared with a case where the metal layer 44 is not formed. Accordingly, the differential impedance can be not more than 100 Ω while the ratio of the thickness t1 of the wiring trace 42 to the distance d between the adjacent wiring traces 42 is maintained at 0.8 or more. This sufficiently provides impedance matching between the transmission line pair and low impedance elements.

(4) Modifications

Another insulating material such as epoxy instead of polyimide may be employed as the materials for the base insulating layer 43 and the cover insulating layer 45 of the FPC board 41, and another metal such as gold (Au) and aluminum or an alloy such as a copper alloy and an aluminum alloy instead of copper may be employed as the materials for the wiring trace 42 and the metal layer 44.

(5) Correspondences Between Elements in the Claims and Parts in Embodiments

In the following paragraphs, non-limiting examples of correspondences between various elements recited in the claims below and those described above with respect to various preferred embodiments of the present invention are explained.

In the foregoing embodiment, the FPC board 41 is an example of a printed circuit board, the base insulating layer 43 is an example of a first insulating layer, the cover insulating layer 45 is an example of a second insulating layer, the wiring trace 42 is an example of a conductor line, and the metal layer 44 is an example of a conductive layer.

As each of various elements recited in the claims, various other elements having configurations or functions described in the claims can be also used.

Figure 5:
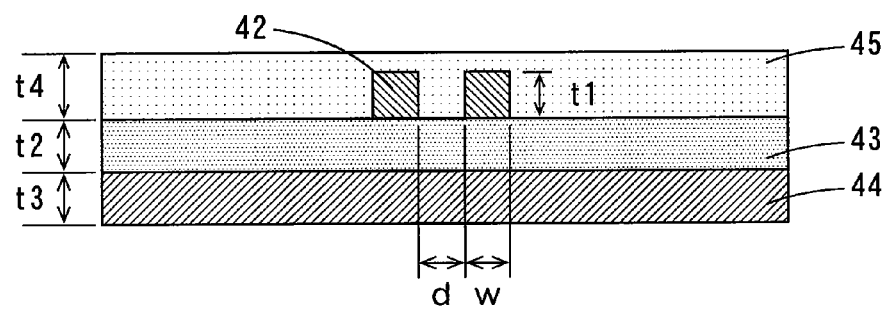
FIG. 5 is a schematic sectional view of an FPC board of an inventive example and a comparative example.

(6) Inventive Example (6-1) FPC Boards of Inventive Example and Comparative Example In each of the following inventive example and comparative example, the FPC board shown in FIG. 5 was fabricated based on the foregoing embodiment. FIG. 5 is a schematic sectional view of the FPC board of the inventive example and the comparative example.

In the FPC board of FIG. 5, a pair of wiring traces 42 is formed on the base insulating layer 43. The cover insulating layer 45 is formed on the base insulating layer 43 to cover the pair of wiring traces 42. The metal layer 44 is formed on the back surface of the base insulating layer 43.

(6-2) Suitable Aspect Ratio of the FPC Board

In the inventive example and the comparative example, the FPC boards having different aspect ratios (t1/d) while holding the differential impedance of the transmission line pair at about 100 Ω were fabricated by adjusting the width w of the wiring trace 42, the distance d between the adjacent wiring traces 42, the thickness t1 of the wiring trace 42, the thickness t2 of the base insulating layer 43, the thickness t3 of the metal layer 44 and the thickness t4 of the cover insulating layer 45. Note that differential output impedance of a general circuit element is about 100 Ω. Therefore, the differential impedance of the differential line pair was set to about 100 Ω.

In the FPC board of the inventive example, the width w of the wiring trace 42 was 10 μm, the distance d between the adjacent wiring traces 42 was 20 μm, the thickness t1 of the wiring trace 42 was 16 μm, the thickness t2 of the base insulating layer 43 was 25 μm, the thickness t3 of the metal layer 44 was 16 μm, and the thickness t4 of the cover insulating layer 45 was 10 μm. The aspect ratio of the FPC board was 0.8.

In the FPC board of the comparative example, the width w of the wiring trace 42 was 60 μm, the distance d between the adjacent wiring traces 42 was 60 μm, the thickness t1 of the wiring trace 42 was 12 μm, the thickness t2 of the base insulating layer 43 was 25 μm, the thickness t3 of the metal layer 44 was 12 μm, and the thickness t4 of the cover insulating layer 45 was 10 μm. The aspect ratio of the FPC board was 0.2.

The noise emission at the time of the transmission of the high-frequency signals in each of the FPC boards of the inventive example and the comparative example was measured using the following method.

Each of the FPC boards of the inventive example and the comparative example was set on a table, and a signal generator for inputting the high-frequency signals was connected to the wiring traces 42 of each FPC board. Furthermore, a magnetic near-field probe was fixed at a position that is upwardly spaced from the wiring traces 42 by 1 mm. The high-frequency signal of 2 Gbps was transmitted to each FPC board using the signal generator, and the high-frequency noise emitted from the wiring traces 42 at the time of the transmission was detected by a spectrum analyzer via the magnetic near-field probe. Results of the measurement of the high-frequency noise are shown in Table 1.

TABLE 1

|  | WIDTH w OF WIRING TRACE [μm] | DISTANCE d BETWEEN WIRING TRACES [μm] | THICKNESS t1 OF WIRING TRACE [μm] | THICKNESS t2 OF BASE INSULATING LAYER [μm] | THICKNESS t3 OF METAL LAYER [μm] | THICKNESS t4 OF COVER INSULATING LAYER [μm] | ASPECT RATIO (t1/d) | NOISE EMISSION [dB] |
|---|---|---|---|---|---|---|---|---|
| INVENTIVE EXAMPLE | 10 | 20 | 16 | 25 | 16 | 10 | 0.8 | 0 |
| COMPARATIVE EXAMPLE | 60 | 60 | 12 | 25 | 12 | 10 | 0.2 | 7 |

As shown in Table 1, the high-frequency noise at the position upwardly spaced from the wiring traces 42 by 1 mm was 0 dB and 7 dB in the FPC boards of the inventive example and the comparative example, respectively.

It was found from the results of the inventive example and the comparative example that the high-frequency noise is not detected at the position upwardly spaced from the wiring traces 42 by 1 mm when the aspect ratio (t1/d) of the wiring trace 42 was 0.8 or more.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:

a first insulating layer;

first, second, third, fourth, fifth, sixth, seventh and eighth connection terminals formed on one surface of said first insulating layer;

a first conductor line formed between said first connection terminal and said second connection terminal;

a second conductor line formed between said third connection terminal and said fourth connection terminal;

a third conductor line formed between said fifth connection terminal and said sixth connection terminal; and a fourth conductor line formed between said seventh connection terminal and said eighth connection terminal, wherein:

said first and second conductor lines constitute a first transmission line pair, said third and fourth conductor lines constitute a second transmission line pair, a thickness of said first insulating layer is not less than 4 μm and not more than 50 μm, a distance between said first and second conductor lines and a distance between said third and fourth conductor lines is not less than 10 μm and not more than 30 μm, a thickness of each of said first, second, third and fourth conductor lines is not less than 8 μm and not more than 20 μm, a ratio of the thickness of each of said first, second, third and fourth conductor lines to the distance between said first and second conductor lines and the distance between said third and fourth conductor lines is 0.8 or more, each of said first, second, third and fourth conductor lines has a constant width, and portions of said first insulating layer overlapping said first, second, third and fourth conductor lines have a constant thickness.

2. The printed circuit board according to claim 1, further comprising a conductive layer formed on the other surface of said first insulating layer, wherein a differential impedance of said first and second transmission line pairs is not more than 100Ω.

3. The printed circuit board according to claim 1, further comprising a second insulating layer formed on said one surface of said first insulating layer to cover said first, second, third and fourth conductor lines.

4. The printed circuit board according to claim 1, wherein said first insulating layer is made of polyimide.

* * * * *